United States Patent [19]

Torday et al.

[11] Patent Number: 4,469,567

[45] Date of Patent: Sep. 4, 1984

[54] TREATMENT OF COPPER FOIL

[75] Inventors: John Torday, Newcastle upon Tyne; James McGilly, Whitley Bay, both of England

[73] Assignee: Torday & Carlisle Public Limited Company, North Shields, England

[21] Appl. No.: 556,785

[22] Filed: Dec. 1, 1983

[30] Foreign Application Priority Data

Dec. 1, 1982 [GB] United Kingdom ............... 8234297

[51] Int. Cl.$^3$ ..................... C25D 5/10; C25D 7/06; C25D 11/38
[52] U.S. Cl. ........................ 204/27; 204/40
[58] Field of Search .............. 204/27, 40, 42, 43 Z, 204/43 S, 56 R

[56] References Cited

U.S. PATENT DOCUMENTS 3,857,681 12/1974 Yates ..................................... 204/27
4,282,073 8/1981 Hirt ....................................... 204/40

*Primary Examiner*—Thomas Tufariello
*Attorney, Agent, or Firm*—Cushman Darby & Cushman

[57] ABSTRACT

A method of treating copper foil for use in the production of printed circuit boards to improve the adhesion of the foil to a base material includes the steps of depositing a nodular or dendritic layer of metal such as copper or zinc onto the foil and encapsulating said nodular or dendritic layer of metal with a layer of copper. A barrier layer is deposited over said encapsulating layer of copper, the barrier layer comprising an alloy of zinc, nickel and one or more of the metals lead, selenium, tellurium, tin or arsenic, the resultant structure then being passivated.

10 Claims, No Drawings

TREATMENT OF COPPER FOIL

BACKGROUND OF THE INVENTION

The present invention relates to a method of treating copper foil for use in the production of printed circuit boards to improve the foil's adhesion to a base material, and also to laminates formed as a result of said treatment.

Copper foil used in the manufacture of printed circuit boards is usually bonded to a dielectric base material and many proposals have been made heretofore for improving the strength of the bond between the copper foil and the base material, whilst at the same time attempting to reduce or eliminate the undesirable characteristics commonly known as 'brown staining' and 'undercut' which are revealed after etching.

It has become well-established practice to provide a nodular or dendritic layer of copper on the matt side of the copper foil, said layer being encapsulated by an electroplated layer of smooth copper to provide an adhered structure which offers physical traps for the epoxy resin of the base material during lamination thereto. Prior to lamination, the treatment is passivated, for example by chromate dipping or by cathodic electrolysis of a chromate solution.

However, it is acknowledged that such laminates can suffer from, amongst other things, the aforementioned 'brown staining' which is believed to be as a result of chemical reaction between the copper of the encapsulating layer and certain components of the epoxy resin mix. This defect can result in a lowering of the insulating properties of the base material as well as a lowering of the peel strength of the copper foil to said base material.

In order to overcome this problem, barrier layers containing zinc, typically of zinc or brass, have been applied over the encapsulating copper in an attempt to separate the copper from the epoxy resin, said barrier layers being passivated in the usual manner.

The provision of pure zinc barrier layers reduced the degree of 'brown staining' quite significantly, but other deficiencies remained. More particularly, it was found that, during lamination to the base material, considerable alloying of the zinc of the barrier layer with the underlying encapsulating copper layer occurred, illustrated by the brass colour the treated foil developed. In many instances this caused a substantial loss of peel strength.

Increasing the thickness of the zinc barrier layer can reduce this effect with consequential improvement in peel strength. However the product then becomes prone to the 'undercutting' phenomenon during etching, caused by attack of the etchant on the unconverted zinc layer, whereby the bond of the copper track to the insulating board is significantly undermined.

The provision of brass barrier layers obviated the above-mentioned problems associated with pure zinc, but the 'anti-staining' characteristics of electroplated brass were not perfect, and, with certain chemically-reactive epoxy layers, an unacceptable level of 'brown staining' remained.

In our co-pending U.S. patent application Ser. No. 425,081 we disclose a treatment which includes the step of providing a barrier layer between an encapsulating layer of copper and the epoxy resin, which barrier layer comprises an alloy of zinc and nickel. Such barrier layers, within certain chemical composition limits, combine the necessary inertness with ease of etching and absence of undercutting, especially when passivated.

However, in certain circumstances there is a tendency for the nickel zinc alloy to exhibit a higher degree of powderyness than is desirable, which can result in the transfer of microcrystalline particles of the alloy onto the laminate.

SUMMARY OF THE INVENTION

According to the present invention there is provided a method of treating copper foil including the steps of electrodepositing onto the foil a nodular or dendritic layer of metal, encapsulating said nodular or dendritic layer of metal with a layer of copper, applying over said encapsulating layer of copper a barrier layer comprising an alloy of zinc, nickel and at least one of the metals selected from the group lead, selenium, tellurium, tin and arsenic, and passivating the resultant structure.

A preferred method provides a barrier layer containing between 0.1% and 4% of lead and between 5% and 25% of nickel, the balance being zinc.

The barrier layer may be achieved by electroplating from a bath containing nickel sulphate, zinc sulphate, ammonia and a citrate using a lead anode, or, preferably, by electroplating from a bath containing nickel sulphate, zinc sulphate, ammonia, a citrate and lead in solution using, for example, a stainless steel or nickel anode.

Conveniently passivation of the structure is achieved by means of chromate dipping or by cathodic electrolysis of a chromate solution.

A laminate according to the invention comprises a dielectric substrate to which is bonded copper foil treated as detailed above.

DESCRIPTION OF THE PREFERRED METHODS

A copper foil on the matt surface of which has been electrodeposited a nodular or dendritic layer of copper or zinc, which layer had subsequently been encapsulated with a continuous layer of smooth electroplated copper, is then subjected to the following bath:

| | |
|---|---|
| $ZnSO_4 1H_2O$ | 100 g/l |
| $NiSO_4 6H_2O$ | 50 g/l |
| Citric acid | 100 g/l |
| Pb as acetate | 50 ppm |
| Ph (by addition of ammonia) | 9.2 |
| Temperature | 25° C. |
| Current density | 2 amps/dm$^2$ |
| Time of plating | 12 seconds |
| Anode | stainless steel |

These conditions produce a smooth and continuous barrier layer comprising an alloy of nickel, zinc and lead, there being about 2% of lead, 12.7% of nickel and the balance being zinc.

The useful range of nickel content is between 5% and 25%, below 5% there being a tendency for the alloy deposit to diffuse into the underlying copper with subsequent loss of adhesion, while above 25% the etchability of the barrier layer in conventional alkali etchants is too slow for practical purposes.

The percentage of nickel in the deposit is relatively insensitive to the current density, as is illustrated in the following table, other conditions being as in the above example:

| current density (amps/dm$^2$) | % nickel |
|---|---|
| 1.5 | 13.8 |
| 2.0 | 12.7 |
| 2.5 | 13.3 |
| 3.0 | 14.8 |
| 5.0 | 13.0 |

The nickel content can be varied by altering the relative chemical concentrations of zinc and nickel in solution as follows:

|  | A | B | C |
|---|---|---|---|
| ZnSO$_4$1H$_2$O | 50 g/l | 50 g/l | 50 g/l |
| NiSO$_4$6H$_2$O | 12.5 g/l | 25 g/l | 37.5 g/l |
| Citric acid | 50 g/l | 50 g/l | 50 g/l |
| pH (by ammonia addition) | 8.3 | 8.3 | 8.3 |
| Current density | 2 amps/dm$^2$ | 2 amps/dm$^2$ | 2 amps/dm$^2$ |
| Time of plating | 12 secs | 12 secs | 12 secs |
| Pb as acetate | 150 ppm | 150 ppm | 150 ppm |
| Anode | | Nickel or Stainless Steel | |
| % Ni in deposit | 5.9 | 9.7 | 12.0 |

As the percentage of nickel increases, the colour changes from a light grey to a violet-grey colour. For practical purposes, however, it is best to choose a given chemical composition for the bath, as exmplified above, in which case the nickel content of the deposit is relatively insensitive to changes in current density as can be appreciated from the above table.

In an alternative method of treating the copper foil to provide the required barrier layer, the addition of lead in solution to the bath can be substituted by the use of a lead anode. For example, stable plating baths could be prepared as follows:

|  | A | B |
|---|---|---|
| ZnSO$_4$1H$_2$O | 50 g/l | 100 g/l |
| NiSO$_4$6H$_2$O | 25 g/l | 50 g/l |
| Citric acid | 50 g/l | 100 g/l |
| pH (by addition of ammonia) | 9.2 | 9.2 |
| Temperature | 20 to 50° C. | 20 to 50° C. |
| Current density | 1 to 5 amps/dm$^2$ | 1 to 5 amps/dm$^2$ |
| Anode | Pb | Pb |

Such conditions produce a smooth and continuous barrier layer containing small but measurable amounts of lead.

In all the above examples, the structures so formed are passivated prior to lamination to a dielectric substrate, for example by dipping them in dilute chromate solution or by cathodic electrolysis of a chromate solution.

The provision of such barrier layers containing small amounts of lead eliminates the powdery nature of the layer that can otherwise occur, and therefore eliminates the possibility of transfer of microcrystalline particles of alloy into the substrate and the consequential 'staining' of the base laminate.

Although described as containing lead to effect the desired result, the barrier layer of laminates according to the invention may comprise alloys of nickel and zinc with one or more of the metals lead, tin, arsenic, selenium and tellurium.

What we claim and desire to secure by Letters Patent is:

1. A method of treating copper foil including the steps of electrodepositing onto the foil a nodular, dendritic layer of metal, encapsulating said nodular, dendritic layer of metal with a layer of copper, applying over said encapsulating layer a barrier layer comprising an alloy of zinc, nickel and at least one of the metals selected from the group lead, selenium, tellurium, tin and arsenic, and passivating the resultant structure.

2. A method according to claim 1 in which the barrier layer contains between 0.1% and 4% of lead and between 5% and 25% of nickel, the balance being zinc.

3. A method according to claim 2 in which the barrier layer is electroplated from a bath containing nickel sulphate, zinc sulphate, ammonia, a citrate and lead in solution using a stainless steel anode.

4. A method according to claim 2 in which the barrier layer is electroplated from a bath containing nickel sulphate, zinc sulphate, ammonia, a citrate and lead in solution using a nickel anode.

5. A method according to claim 2 in which the barrier layer is electroplated from a bath containing nickel sulphate, zinc sulphate, ammonia and a citrate using a lead anode.

6. A method according to claim 1 in which passivation is achieved by means of chromate dipping.

7. A method according to claim 1 in which passivation is achieved by means of cathodic electrolysis of a chromate solution.

8. A method according to claim 1 in which the nodular, dendritic layer deposited onto the copper foil is copper.

9. A method according to claim 1 in which the nodular, dendritic layer deposited onto the copper foil is zinc.

10. A laminate comprising a dielectric substrate to which is bonded copper foil treated according to the method of claim 1.

* * * * *